(12) United States Patent
Geiss et al.

(10) Patent No.: US 8,592,302 B2
(45) Date of Patent: Nov. 26, 2013

(54) PATTERNING METHOD FOR FABRICATION OF A SEMICONDUCTOR DEVICE

(75) Inventors: Erik P. Geiss, Saratoga Springs, NY (US); Peter Baars, Dresden (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 98 days.

(21) Appl. No.: 13/307,079

(22) Filed: Nov. 30, 2011

(65) Prior Publication Data

US 2013/0137269 A1    May 30, 2013

(51) Int. Cl.
*H01L 21/4763* (2006.01)
(52) U.S. Cl.
USPC ........... 438/618; 438/620; 438/622; 438/623; 438/624; 438/636; 438/637
(58) Field of Classification Search
None
See application file for complete search history.

(56) References Cited

U.S. PATENT DOCUMENTS

| 2006/0091431 | A1* | 5/2006 | Kanzawa | 257/284 |
| 2007/0009840 | A1* | 1/2007 | Kim et al. | 430/313 |
| 2008/0076244 | A1* | 3/2008 | Ye et al. | 438/597 |
| 2009/0146296 | A1* | 6/2009 | Ye et al. | 257/734 |

* cited by examiner

*Primary Examiner* — Duy Deo
(74) *Attorney, Agent, or Firm* — Ingrassia Fisher & Lorenz, P.C.

(57) ABSTRACT

A patterning method is provided for fabrication of a semiconductor device structure having conductive contact elements, an interlayer dielectric material overlying the contact elements, an organic planarization layer overlying the interlayer dielectric material, an antireflective coating material overlying the organic planarization layer, and a photoresist material overlying the antireflective coating material. The method creates a patterned photoresist layer from the photoresist material to define oversized openings corresponding to respective conductive contact elements. The antireflective coating is etched using the patterned photoresist as an etch mask. A liner material is deposited overlying the patterned antireflective coating layer. The liner material is etched to create sidewall features, which are used as a portion of an etch mask to form contact recesses for the conductive contact elements.

10 Claims, 16 Drawing Sheets

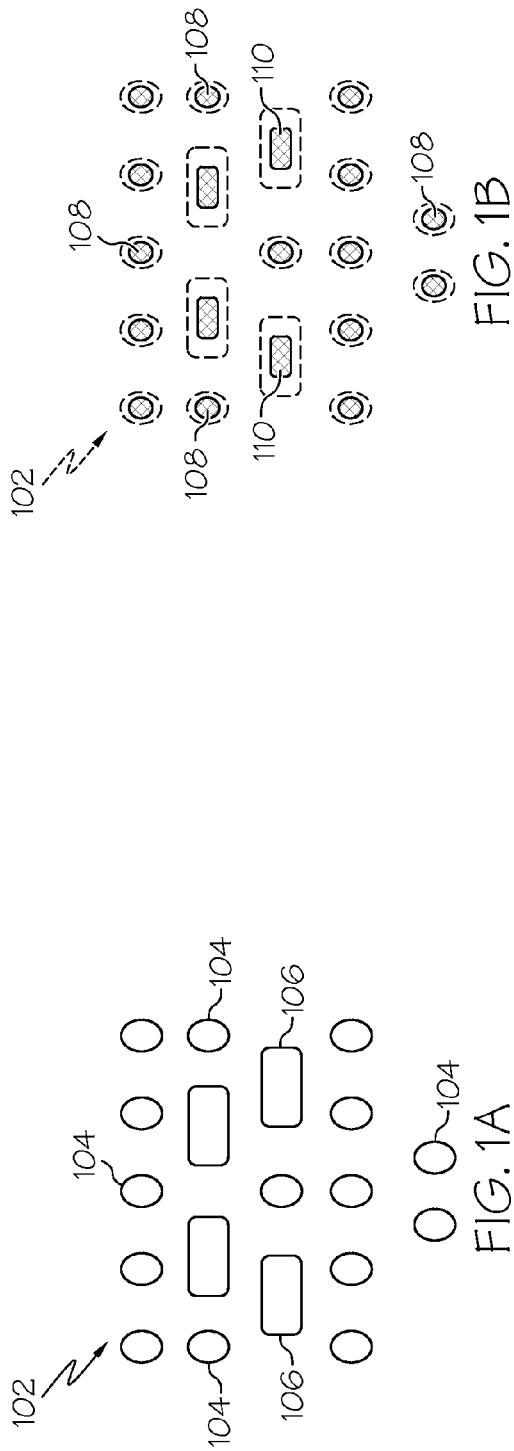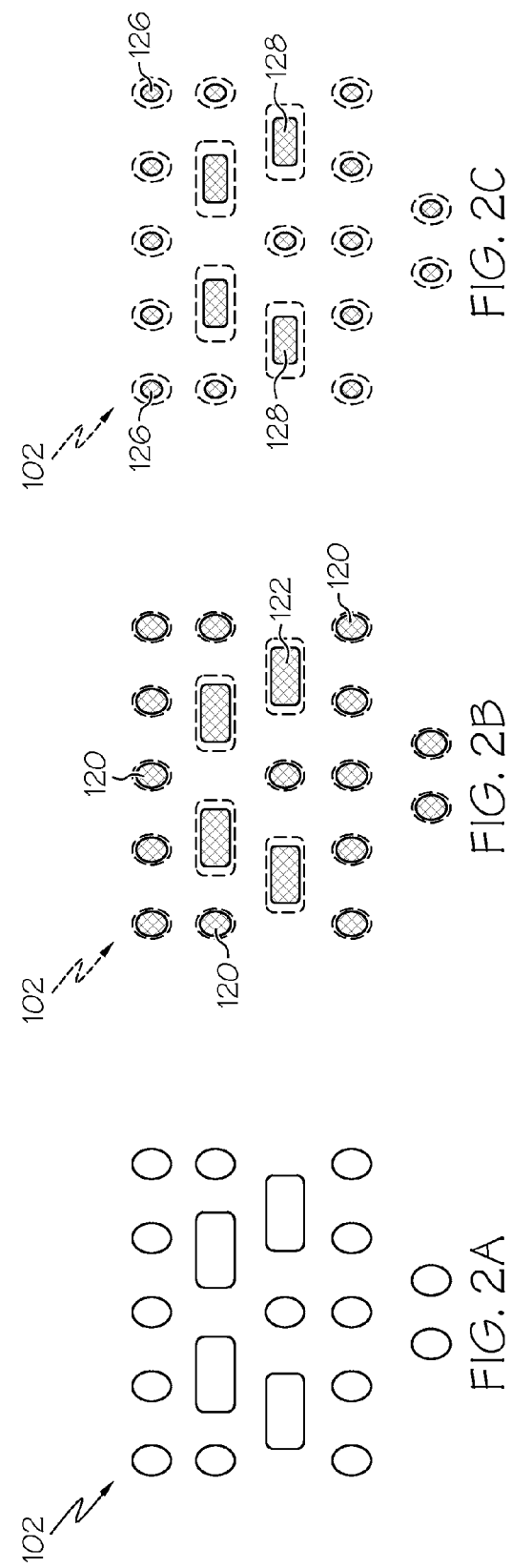

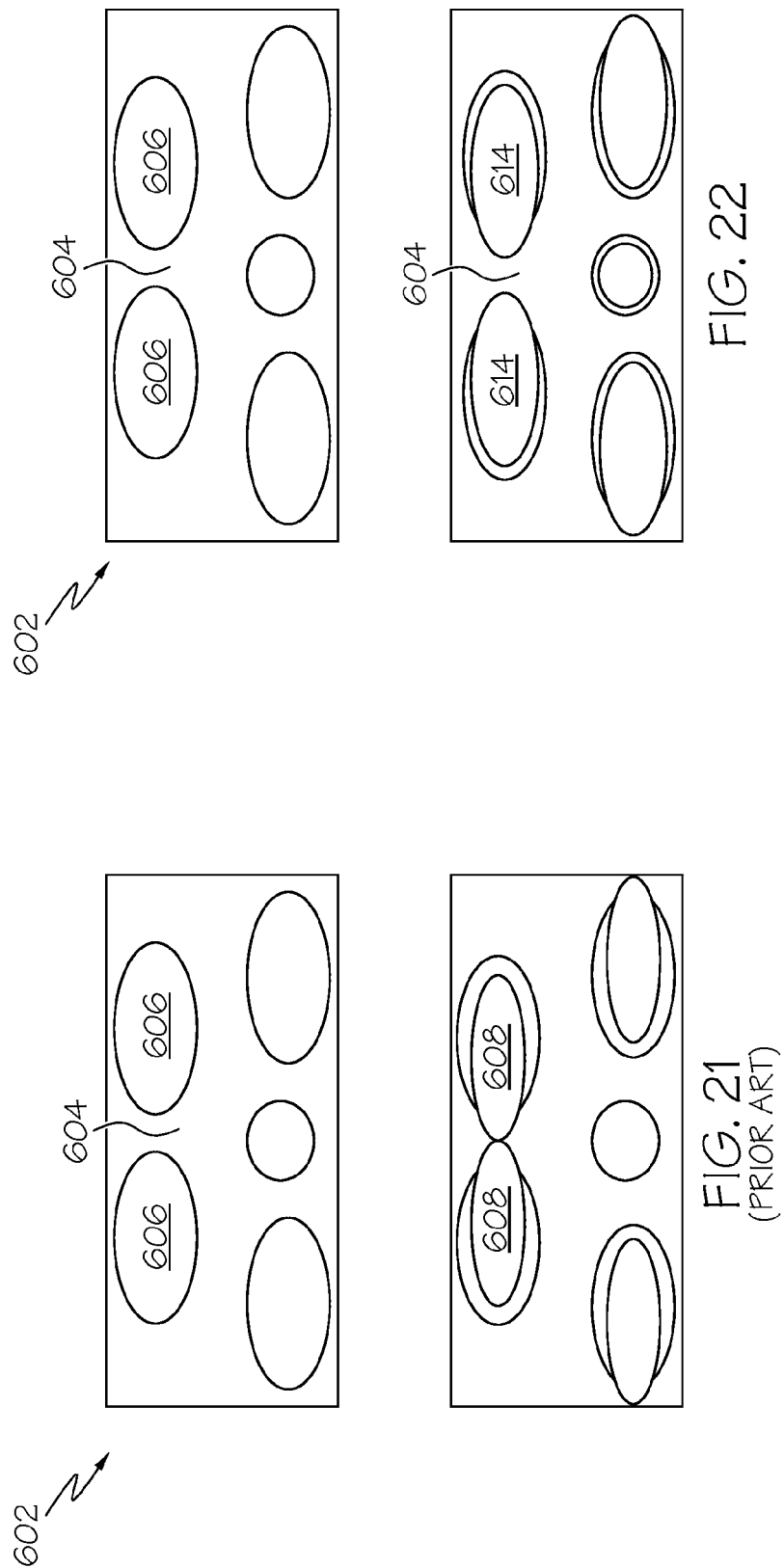

PATTERNING METHOD FOR FABRICATION OF A SEMICONDUCTOR DEVICE

TECHNICAL FIELD

Embodiments of the subject matter described herein relate generally to the fabrication of semiconductor devices. More particularly, embodiments of the subject matter relate to patterning techniques for etching of small scale via and contact plug shapes.

BACKGROUND

The majority of present day integrated circuits (ICs) are implemented by using a plurality of interconnected field effect transistors (FETs), which may be realized as metal oxide semiconductor field effect transistors (MOSFETs or MOS transistors). A MOS transistor may be realized as a p-type device (i.e., a PMOS transistor) or an n-type device (i.e., an NMOS transistor). Moreover, a semiconductor device can include both PMOS and NMOS transistors, and such a device is commonly referred to as a complementary MOS or CMOS device. A MOS transistor includes a gate electrode as a control electrode that is formed over a semiconductor substrate, and spaced-apart source and drain regions formed within the semiconductor substrate and between which a current can flow. The source and drain regions are typically accessed via respective conductive contacts formed on the source and drain regions. Bias voltages applied to the gate electrode, the source contact, and the drain contact control the flow of current through a channel in the semiconductor substrate between the source and drain regions beneath the gate electrode. Conductive metal interconnects (plugs) formed in an insulating layer are typically used to deliver bias voltages to the gate, source, and drain contacts. Small scale and discrete plugs can be used with one gate, source, or drain contact, while larger sized plugs can be used to cross couple two contacts such as the gate and the source of a transistor. Cross coupled terminals are commonly used in static random access memory (SRAM) devices.

Small scale devices technologies, such as 32 nanometer (and smaller) processes may require extremely small contact plugs. Fabrication of such contact plugs may be accomplished with contact patterning techniques that employ dimensional shrinkage from a photolithography based pattern to the resulting feature corresponding to the pattern. For example, aggressive etch based targeting for critical via/contact shapes may call for a relatively large amount of feature shrinkage. Unfortunately, larger electrically active features may become too small due to the innate issue with etch based feature size loading (large features will shrink faster than smaller ones). Such feature size dependent micro-loading is a common phenomenon seen in plasma etching.

In contact patterning where a cross coupled contact and a contact hole are being patterned on the same mask, feature size dependent micro-loading can lead to a situation where there is no room to increase the size of the cross coupled contact on the photoresist mask (due to the amount and density of patterned features), and the degree of etch induced shrink required for contact hole critical dimension targeting may lead to a situation where the cross coupled contact will not have sufficient coverage to establish good ohmic contact to the gate and to the active region of interest.

Accordingly, it is desirable to have an improved contact patterning technique that can be used to effectively create conductive plugs having the minimum critical dimension and cross coupled plugs having larger dimensions. In addition, it is desirable to have an improved contact patterning technique that reduces the likelihood of feature merging in small scale technology nodes. Furthermore, other desirable features and characteristics will become apparent from the subsequent detailed description and the appended claims, taken in conjunction with the accompanying drawings and the foregoing technical field and background.

BRIEF SUMMARY

An exemplary embodiment of a method of fabricating a semiconductor device is presented here. The method begins by forming an organic planarization layer overlying a semiconductor device structure having conductive contact elements, forming an antireflective coating layer overlying the organic planarization layer, and forming a photoresist layer overlying the antireflective coating layer. The method continues by removing portions of the photoresist layer to create a patterned photoresist layer having openings corresponding to the conductive contact elements, and etching the antireflective coating layer using the patterned photoresist layer as a first etch mask, resulting in a patterned antireflective coating layer. The method continues by etching the organic planarization layer using the patterned antireflective coating layer as a second etch mask, resulting in a patterned organic planarization layer having recesses formed therein. A conformal liner is formed within the recesses, and the conformal liner is etched to expose an interlayer dielectric of the semiconductor device structure.

Another exemplary embodiment of a method of fabricating a semiconductor device is also provided. The method forms an organic planarization layer overlying a semiconductor device structure having conductive contact elements, forms an antireflective coating layer overlying the organic planarization layer, and forms a photoresist layer overlying the antireflective coating layer. The method continues by removing portions of the photoresist layer to create a patterned photoresist layer having openings corresponding to the conductive contact elements, and etching the antireflective coating layer using the patterned photoresist layer as a first etch mask, resulting in a patterned antireflective coating layer having openings defined therein. The method continues by forming a conformal liner overlying the patterned antireflective coating layer and within the openings defined in the patterned antireflective coating layer, and etching the conformal liner to expose portions of the organic planarization layer. The etching of the conformal liner results in lined sidewalls for the openings defined in the patterned antireflective coating layer.

An exemplary embodiment of a patterning method for fabrication of a semiconductor device structure is also presented here. The device structure includes conductive contact elements, an interlayer dielectric material overlying the conductive contact elements, an organic planarization layer overlying the interlayer dielectric material, an antireflective coating material overlying the organic planarization layer, and a photoresist material overlying the antireflective coating material. The patterning method begins by creating a patterned photoresist layer from the photoresist material, the patterned photoresist layer defining oversized openings corresponding to respective conductive contact elements of the semiconductor device structure. The method continues by etching the antireflective coating material using the patterned photoresist layer as a first etch mask, resulting in a patterned antireflective coating layer. The method conformally deposits a liner material overlying at least the patterned antireflective coating layer, and directionally etches the deposited liner material to create sidewall features formed from the liner material. The sidewall features are used as at least a portion of a second etch mask to form contact recesses for the conductive contact elements.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 1 is a diagram that illustrates shrinkage of patterned features;

FIG. 2 is a diagram that illustrates the shrinkage effects associated with an exemplary embodiment of the fabrication process presented herein;

FIG. 21 is a schematic top view that illustrates feature merging associated with a conventional fabrication process; and FIG. 22 is a schematic top view that illustrates feature separation associated with an exemplary embodiment of the fabrication process presented herein.

DETAILED DESCRIPTION

Figure 3:
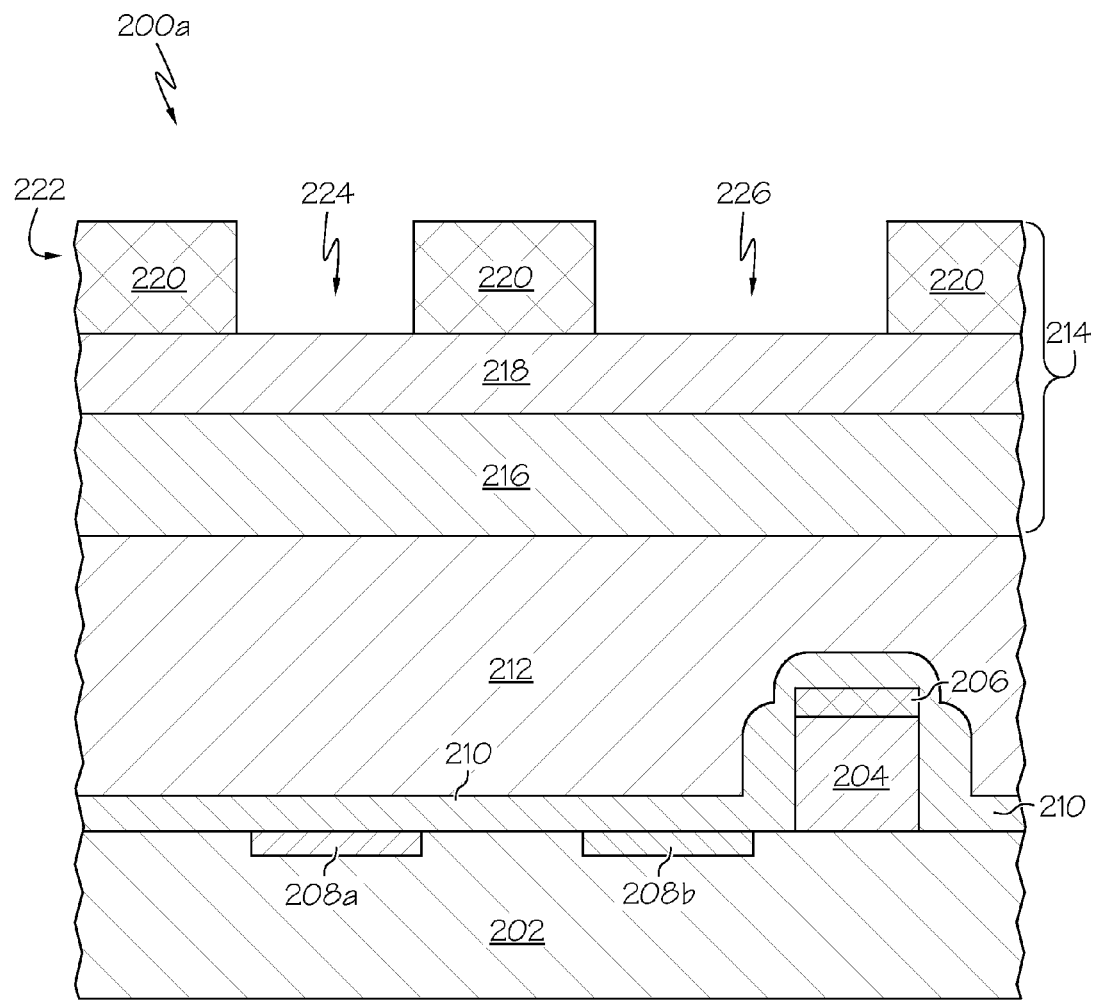
FIGS. 3-10 are cross sectional views that illustrate an exemplary semiconductor device structure and its related fabrication process.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of a feature or element within a consistent but arbitrary frame of reference which is made clear by reference to the text and the associated drawings describing the item under discussion. Such terminology may include the words specifically mentioned above, derivatives thereof, and words of similar import. Similarly, the terms "first", "second", and other such numerical terms referring to structures do not imply a sequence or order unless clearly indicated by the context.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based transistors are well known and so, in the interest of brevity, many conventional steps will only be mentioned briefly herein or will be omitted entirely without providing the well known process details.

Although the subject matter described here may be utilized to fabricate MOS transistor devices (including NMOS transistor devices, PMOS transistor devices, and CMOS transistor devices) for a variety of different applications, the exemplary embodiments relate to static random access memory (SRAM) devices, which typically include a large number of contact plugs and cross coupled (shared) contacts. In this regard, FIG. 1 is a diagram that illustrates shrinkage of patterned features that correspond to individual contact plugs and cross coupled contacts. The left side of FIG. 1 is a schematic top view of a patterned photoresist layer 102 having a plurality of contact openings 104 (depicted as small round shapes) and a plurality of cross coupled contact openings 106 (depicted as larger rectangular shapes) defined therein. The patterned photoresist layer 102 is used in accordance with a conventional fabrication process to create contact plugs corresponding to the contact openings 104 and to create shared contact plugs corresponding to the cross coupled contact openings 106.

The right side of FIG. 1 is a schematic top view that depicts the resulting contact plugs 108 and shared contact plugs 110 created from the patterned photoresist layer 102. To better illustrate the amount of feature shrinkage associated with the formation of the contact plugs 108 and the shared contact plugs 110, the right side of FIG. 1 depicts the patterned photoresist layer 102 in dashed lines. Notably, the amount of feature shrinkage is nonlinear in that larger features shrink more than smaller features. The right side of FIG. 1 shows this nonlinear characteristic—the larger shared contact plugs 110 have shrunk proportionately more than the smaller individual contact plugs 108 (relative to the corresponding contact openings 104 and cross coupled contact openings 106). The increased shrinkage rate for the larger shared contact plugs 110 is undesirable in small node technologies where excess shrinkage may cause the shared contact plugs 110 to be misaligned or to "miss" their intended device contacts and/or cause inadequate electrical coupling between the shared contact plugs 110 and the device contacts.

The contact patterning approaches described herein address the nonlinear shrinkage phenomena and related issues. In this regard, the left side of FIG. 2 is identical to the left side of FIG. 1, and the same patterned photoresist layer 102 is schematically depicted. The middle of FIG. 2 is a schematic top view of the semiconductor device structure at an intermediate stage of the fabrication process. At this stage, an antireflective coating layer has been etched in a manner that forms a mask with openings having relaxed taper profiles (i.e., relatively steep sidewalls that are inwardly angled from top to bottom). The upper dimensions of these openings roughly correspond to the dimensions of the contact openings 104 and the cross coupled contact openings 106 in the patterned photoresist layer 102. The lower dimensions of these openings, however, represent shrinkage relative to the corresponding features in the patterned photoresist layer 102. FIG. 2 shows the lower dimensions of the shrunk contact openings 120 and the shrunk cross coupled contact openings 122. Notably, the relaxed taper is intentionally created to control and reduce the amount of shrinkage at this point in the process (compare the middle of FIG. 2 to the right side of FIG. 1).

The right side of FIG. 2 is a schematic top view that depicts the resulting contact plugs 126 and shared contact plugs 128 created from the patterned photoresist layer 102 and the patterned antireflective coating layer (i.e., the shrunk contact openings 120 and the shrunk cross coupled contact openings 122). In contrast to the process depicted in FIG. 1, the amount of additional feature shrinkage is linear. Accordingly, even though the contact plugs 126 have shrunk to their intended and desired size, the shared contact plugs 128 are larger than their counterparts depicted in FIG. 1. In other words, shrinkage of the larger features has been controlled. Controlling the shrinkage of the shared contact plugs 128 in this manner is desirable to ensure that the shared contact plugs 128 can actually traverse the distance between the device contacts they are intended to bridge.

Controlled shrinkage of large features may be achieved in the following manner. FIGS. 3-10 are cross sectional views that illustrate an exemplary semiconductor device structure 200 and its related fabrication process. FIG. 3 depicts the semiconductor device structure 200a in a state following front end processing. The semiconductor device structure 200 is formed using well known techniques and process steps (e.g., techniques and steps related to doping, photolithography and patterning, etching, material growth, material deposition, surface planarization, and the like), which will not be described in detail here.

Fabrication of the semiconductor device structure 200 may begin by providing a suitable substrate having a layer of semiconductor material 202. In practice, the substrate may be realized as a silicon-on-insulator (SOI) substrate, where the semiconductor material 202 is disposed on a layer of insulator material that, in turn, is supported by a carrier wafer (not shown). In alternate embodiments, the semiconductor device structure 200 can be formed on a bulk silicon substrate rather than an SOI substrate.

The substrate is subjected to various process steps to form the semiconductor device structure 200a depicted in FIG. 3. For this simplified depiction, the semiconductor device structure 200a includes, without limitation: a gate structure 204 overlying the semiconductor material 202; a conductive contact element 206 for the gate structure 204; conductive contact elements 208 for active regions (e.g., source or drain regions); a stress liner 210 overlying the conductive contact elements 206, 208; and an interlayer dielectric (ILD) material 212 overlying the stress liner 210. The conductive contact elements 206, 208 are typically realized as silicide contact areas, and conductive contact elements 206, 208 can be formed using an appropriate silicidation process. The stress liner 210 may be fabricated from a stress-inducing material such as compressive nitride or tensile nitride, as is well understood. The ILD material 212 may be composed of one or more suitable dielectric materials, for example, an oxide material.

FIG. 3 shows the semiconductor device structure 200a after formation of a multilayer mask arrangement 214 overlying the ILD material 212. This particular embodiment of the multilayer mask arrangement 214 includes, without limitation: an organic planarization layer (OPL) 216 overlying the ILD material 212; a layer of antireflective coating (ARC) material 218 overlying the OPL 216; and a layer of photoresist material 220 overlying the layer of ARC material 218. FIG. 3 shows the result of several process steps, which are well known to those familiar with semiconductor device fabrication. More specifically, FIG. 3 shows the semiconductor device structure after the process has formed the OPL 216 overlying the ILD material 212, formed the layer of ARC material 218 overlying the OPL 216, and formed the layer of photoresist material 220 overlying the layer of ARC material 218. FIG. 3 also shows the semiconductor device structure 200a following removal of certain portions of the layer of photoresist material 220 to create a patterned photoresist layer 222. The patterned photoresist layer 222 may be formed using well known process steps associated with the deposition of the photoresist material 220, the exposure and development of the photoresist material 220, cleaning, etc. Conventional photolithographic techniques and other conventional process steps related to the fabrication of the patterned photoresist layer 222 will not be described in detail here.

The patterned photoresist layer 222 includes features that protect certain portions of the underlying layer of ARC material 218, and openings 224, 226 that expose other portions of the layer of ARC material 218. For simplicity, FIG. 3 only depicts two openings 224, 226 in the patterned photoresist layer 222. The opening 224 represents a relatively small opening to be used for the creation of an individual contact plug corresponding to the conductive contact element 208a, and the opening 226 represents a relatively large opening to be used for the creation of a shared contact plug corresponding to both the conductive contact element 206 and the conductive contact element 208b. For this embodiment, the openings 224, 226 are intentionally fabricated as oversized openings in that their dimensions as defined in the photoresist material 220 are larger than the intended final dimensions of their corresponding contact plugs (as explained above with reference to FIG. 2). Although the actual dimensions of the opening 224 may vary from one device to another and for one process node technology to another, for an exemplary embodiment fabricated using 32 nm, 28 nm (and below) node technology, the opening 224 has a typical diameter in the range of about 70-80 nm. The larger opening 226, however, may be rectangular, oval, elliptical, or otherwise oblong in shape. Although the actual dimensions of the opening 226 may vary from one device to another and for one process node technology to another, for an exemplary embodiment fabricated using 32 nm, 28 nm (or below) node technology, the opening 226 has a typical length in the range of about 140-160 nm, and a typical width in the range of about 70-80 nm. These exemplary dimensions are not intended to limit the scope or application of the subject matter, and an embodiment of the semiconductor device structure 200 may utilize openings having different dimensions.

Figure 4:
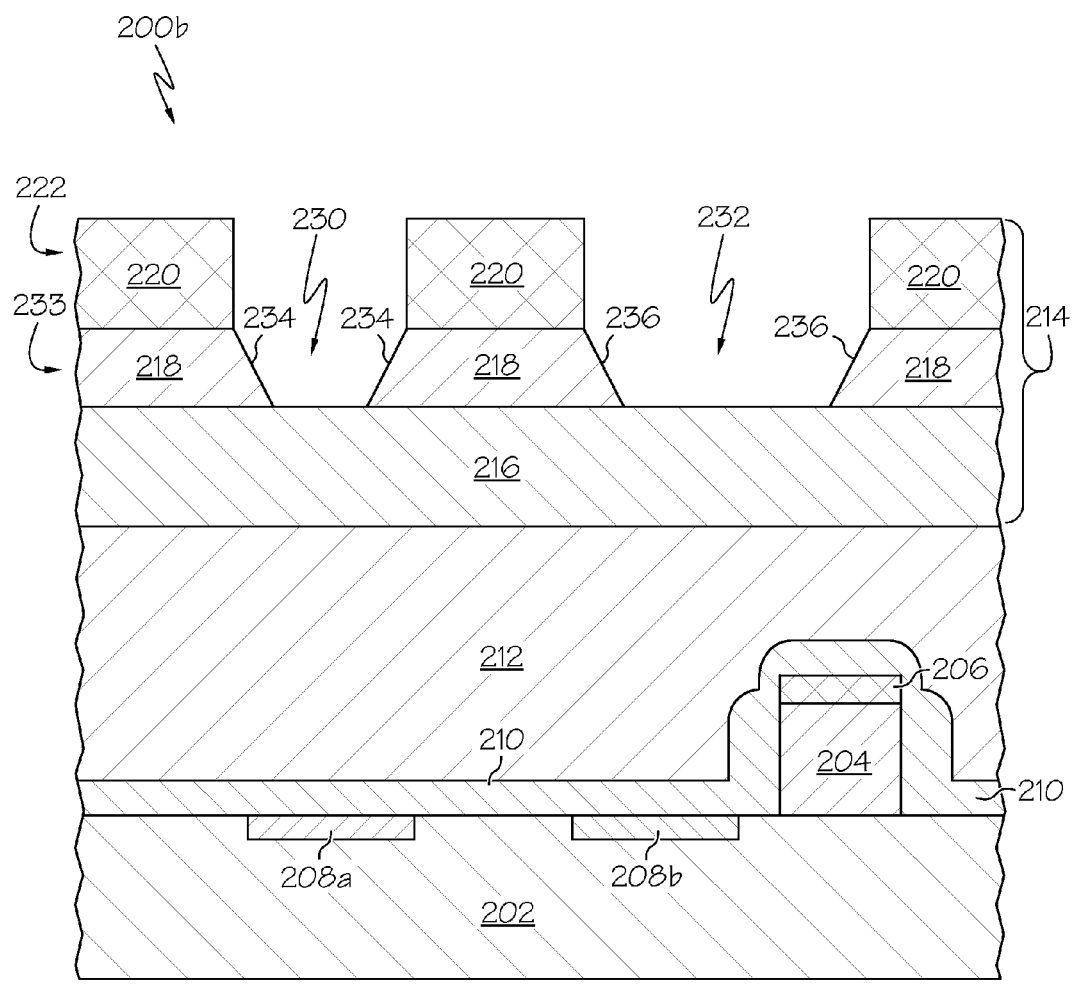

The patterned photoresist layer 222 is used as an etch mask during etching of the layer of ARC material 218. FIG. 4 depicts the state of the semiconductor device structure 200b after etching of the layer of ARC material 218 to form recesses or openings 230, 232 in the ARC material 218. Etching of the layer of ARC material 218 results in a patterned ARC layer 233. In certain embodiments, the openings 230, 232 are created with inwardly tapered sidewalls 234, 236 by plasma etching the ARC material 218 in a controlled manner using specific chemistries. As depicted in FIG. 4, the sidewalls 234, 236 are tapered inwardly in that their upper dimensions are larger than their lower dimensions. This plasma etching step is preferably performed to expose portions of the underlying OPL.

The sidewalls 234, 236 are intentionally formed with a "relaxed" taper profile, relative to conventional approaches that strive to form an "aggressive" taper profile to achieve significant feature shrinkage. In other words, the relaxed taper profile creates relatively steep sidewalls 234, 236 that are closer to vertical than sidewalls formed with an aggressive taper profile. For example, and without limitation, the sidewalls 234, 236 may exhibit a taper angle within the range of about 70-80 degrees. The use of a relaxed taper profile is desirable to accommodate the fabrication of larger contact features that remain separated post-etch and after shrinking, and that do not exhibit excessive shrinkage that could otherwise cause alignment and connection issues.

The inwardly tapered sidewalls 234, 236 are created during the plasma etching step. During plasma etching, sidewall passivation is formed to induce the tapering. A thicker passivation layer is created in larger features because more reactants are liberated during etching. The thicker passivation layer in the larger features in turn causes the higher shrink rate for larger features. The ratio of the different plasma gases is adjusted and/or controlled to provide more or less sidewall taper. In accordance with this technique, smaller diameter holes (such as the opening 230) are created with steeper sidewalls and less shrinkage, while larger holes and openings (such as the opening 232) are created with flatter sidewalls and more shrinkage (during the same plasma etching step). Accordingly, the plasma etching step depicted in FIG. 4 is controlled and adjusted in a suitable manner to obtain the desired taper angles for the inwardly tapered sidewalls 234, 236.

Figure 5:
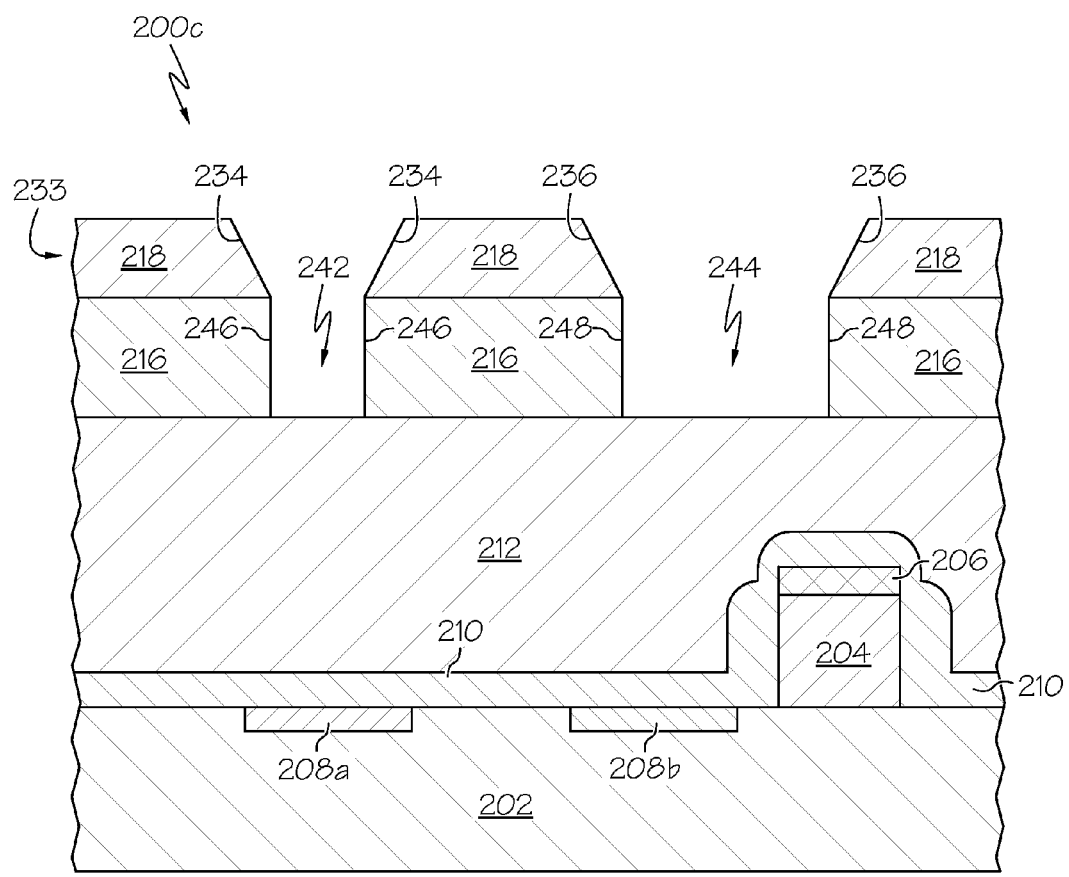

Referring now to FIG. 5, the OPL 216 is etched using the patterned ARC layer 233 as an etch mask. FIG. 5 shows the semiconductor device structure 200c after the OPL 216 has been etched. This etching step results in a patterned OPL 240 having cavities or recesses 242, 244 formed therein. In preferred embodiments, the OPL 216 is anisotropically etched using an etch chemistry that attacks the organic material used for the OPL 216 but does not etch the ARC material 218 by an appreciable amount. In certain embodiments, the OPL 216 is etched by a reactive-ion etching (RIE) process using an organic etching chemistry such as nitrogen/hydrogen.

As shown in FIG. 5, the etching of the OPL 216 also results in the removal of the photoresist material 220, due to the organic nature of the photoresist material 220. The anisotropic nature of this etching step forms vertical sidewalls 246, 248 corresponding to the recesses 242, 244. These vertical sidewalls 246, 248 are defined by, and aligned with, the bottom perimeter shapes of the openings 230, 232 in the patterned ARC layer 233 (see FIG. 4). This etching step is preferably performed to expose portions of the underlying ILD material 212, as depicted in FIG. 5.

Figure 6:
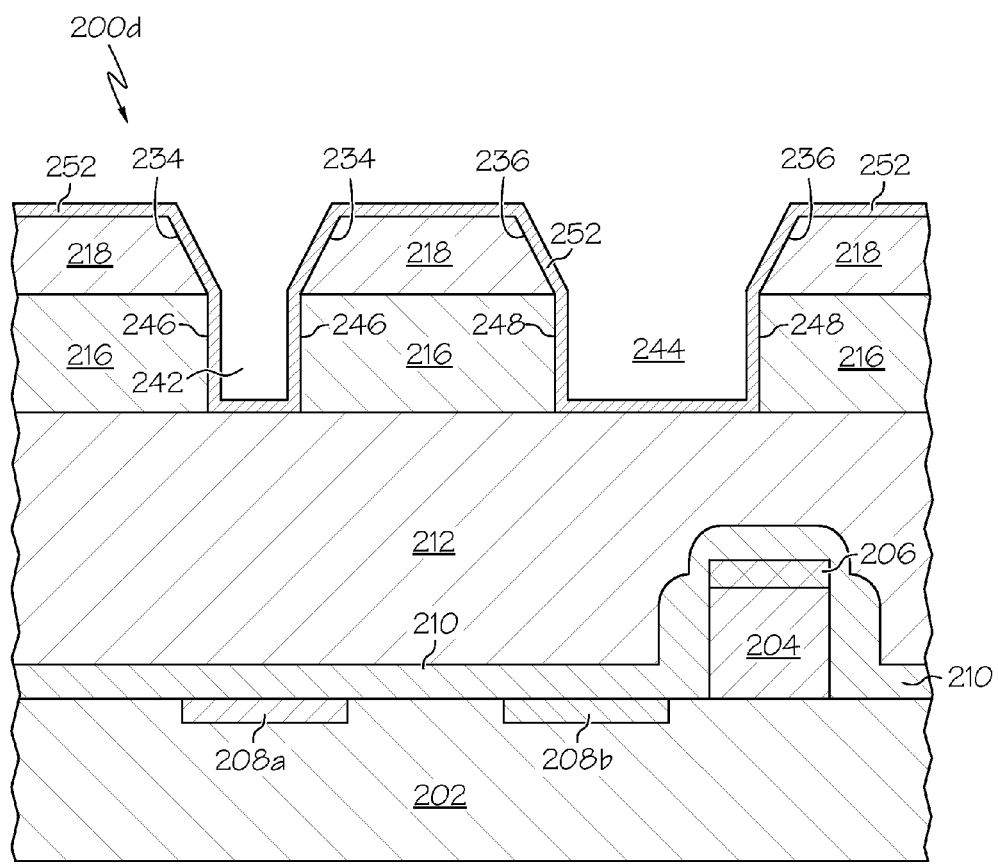

After etching the OPL 216, this embodiment of the fabrication process continues by forming a conformal liner 252 overlying the semiconductor device structure 200c, resulting in the lined semiconductor device structure 200d depicted in FIG. 6. The conformal liner 252 is formed overlying the patterned ARC layer 233 (the exposed portions of the ARC material 218), and within the recesses 242, 244 defined in the OPL 216. In other words, the conformal liner 252 is also formed overlying the exposed sections of the ILD material 212 (i.e., the bottoms of the recesses 242, 244) and overlying the exposed vertical sidewalls 246, 248 of the recesses 242, 244. In certain embodiments, the conformal liner 252 is formed by conformally depositing an organic liner material (such as a polymer material) overlying the exposed portions of the ILD material 212, the vertical sidewalls 246, 248, and the exposed ARC material 218 (including the inwardly tapered sidewalls 234, 236). An organic liner material is used here for purposes of etch selectivity, as will become apparent from the following description. In certain embodiments, the conformal liner 252 is formed by reactive-ion deposition of a fluorocarbon polymer material. Although the result of this deposition step may vary from one device to another, for different process node technology, and/or for different liner material types, the conformal liner 252 will typically be formed to a thickness within the range of about 5-15 nm. The thickness of the conformal liner 252 is controlled to achieve the desired amount of feature shrinkage relative to the size of the recesses 242, 244.

Figure 7:
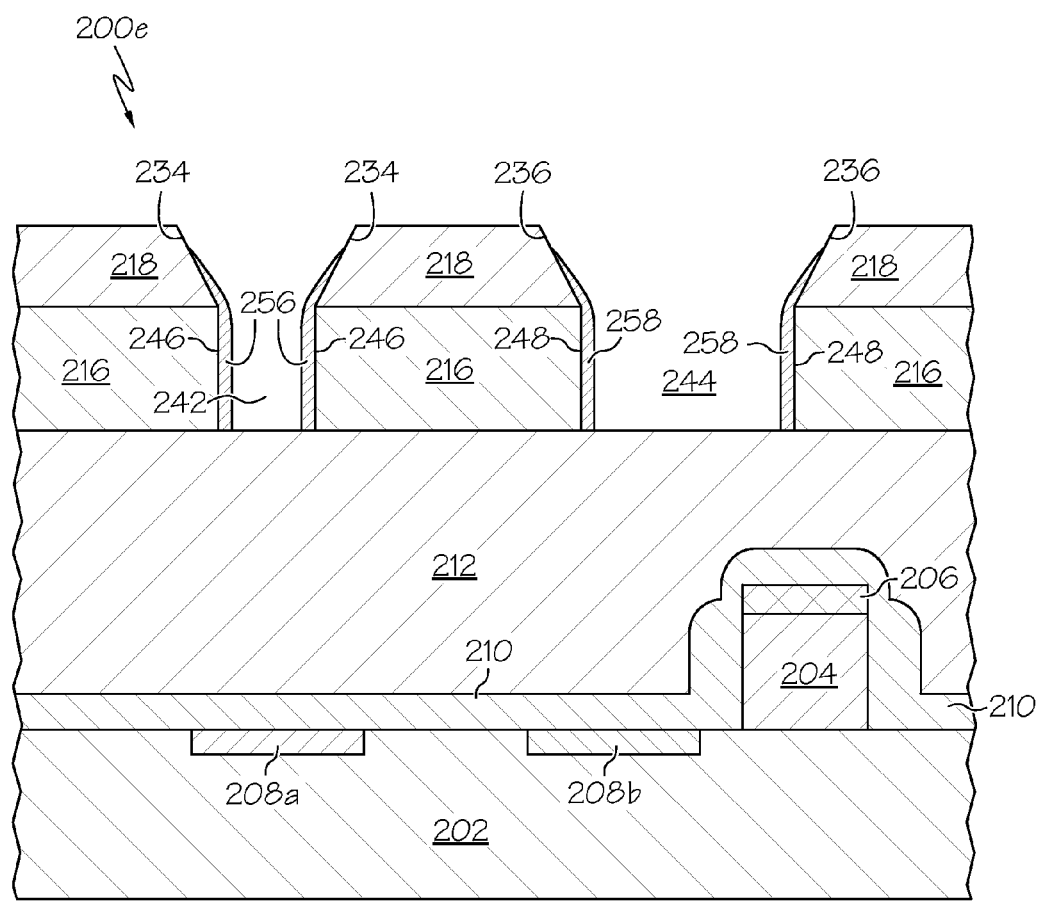

Next, the conformal liner 252 is selectively etched to expose some of the underlying ILD material 212. FIG. 7 depicts the state of the semiconductor device structure 200e after the conformal liner 252 has been etched. This etching step results in lined sidewalls 256, 258 for the recesses 242, 244 formed in the OPL 216. In preferred embodiments, the conformal liner 252 is directionally (i.e., anisotropically) etched using an etch chemistry that attacks the organic liner material but does not etch the ARC material 218 or the ILD material 212 by any appreciable amount. In certain embodiments, the conformal liner 252 is subjected to an RIE process that uses a $CF_4$ based chemistry. As depicted in FIG. 7, the directional nature of this etching step effectively removes the flat sections of the conformal liner 252, i.e., the sections on the top of the ARC material 218 and the sections at the bottoms of the recesses 242, 244. In reality, some of the liner material residing on the tapered sidewalls 234, 236 will also be removed during this etching step.

Figure 8:
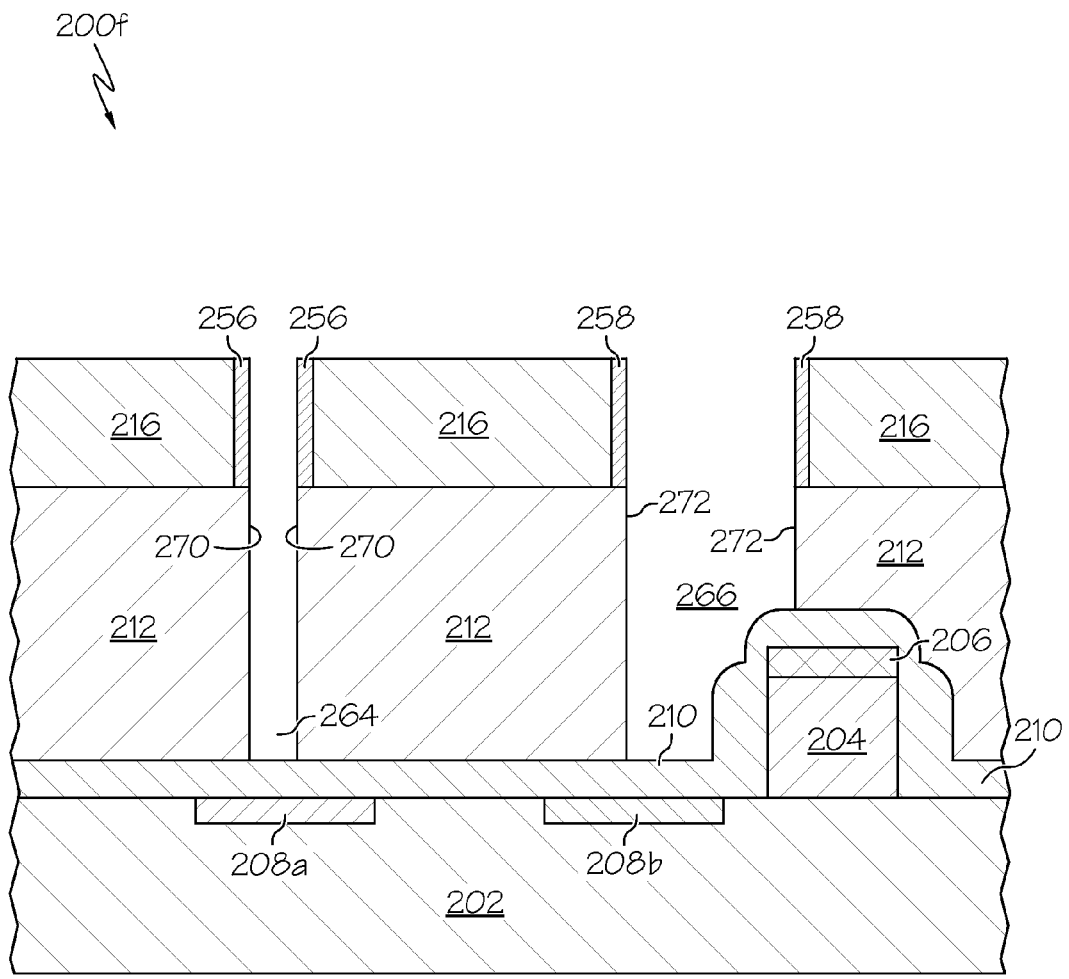

After the lined sidewalls 256, 258 have been fabricated, the process continues by etching the ILD material 212 to form contact recesses 264, 266 in the ILD material 212. FIG. 8 illustrates the semiconductor device structure 200f after formation of the contact recesses 264, 268. In preferred embodiments, the ILD material 212 is anisotropically etched using an etch chemistry that selectively attacks the ILD material 212 without etching the lined sidewalls 256, 258, the OPL 216 material, or the material used for the stress liner 210 by any appreciable amount. In this regard, the lined sidewalls 256, 258, the OPL 216, and (to some extent) the ARC material 218 serves as an etch mask for the creation of the contact recesses 264, 268. In certain embodiments, the ILD material 212 is subjected to an RIE process that uses a $C_XF_YO_2$ based chemistry.

As shown in FIG. 8, the etching of the ILD material 212 also results in the removal of the residual portions of the patterned ARC layer (i.e., the remaining ARC material 218). Moreover, the angled upper ends of the lined sidewalls 256, 258 (shown in FIG. 7) may be removed or reduced during this etching step, at least in part due to the lack of structural support following the removal of the ARC material 218. For the sake of clarity and ease of understanding, FIG. 8 shows the remaining lined sidewalls 256, 258 in a simplified manner. The anisotropic nature of this etching step forms vertical sidewalls 270, 272 corresponding to the recesses 264, 266. These vertical sidewalls 270, 272 are defined by, and aligned with, the lined sidewalls 256, 258. Moreover, this etching step is preferably performed to expose portions of the underlying stress liner 210, as depicted in FIG. 8.

Figure 9:
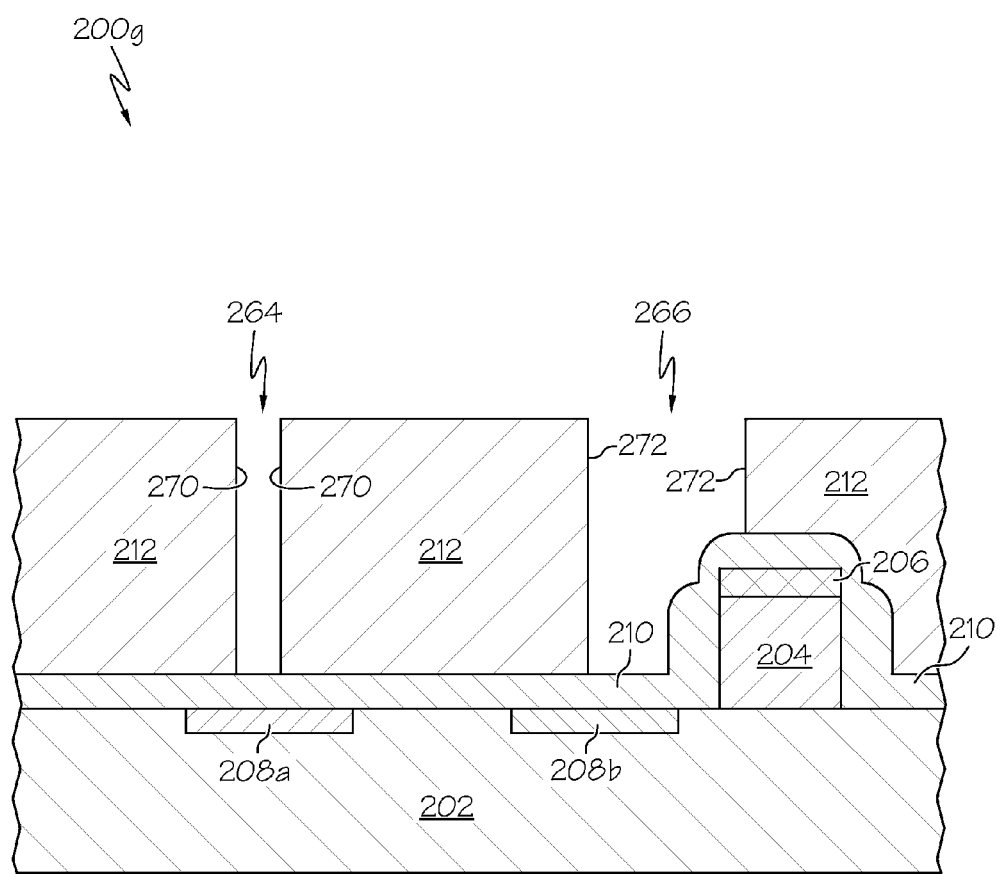

After the contact recesses 264, 266 have been created, the process continues by removing the residual portions of the patterned OPL (i.e., the remaining OPL 216) and by removing the residual portions of the liner material (i.e., the lined sidewalls 256, 258). FIG. 9 depicts the state of the semiconductor device structure 200g following the removal of these features. In practice, the remaining OPL 216 material and the lined sidewalls 256, 258 can be removed by etching with an etchant that selectively attacks organic materials (such as the material used for the OPL 216 and the material used for the conformal liner 252). Accordingly, the ILD material 212 and the stress liner 210 is not etched by any appreciable amount during this step, and the contact recesses 264, 266 retain their dimensions.

Figure 10:
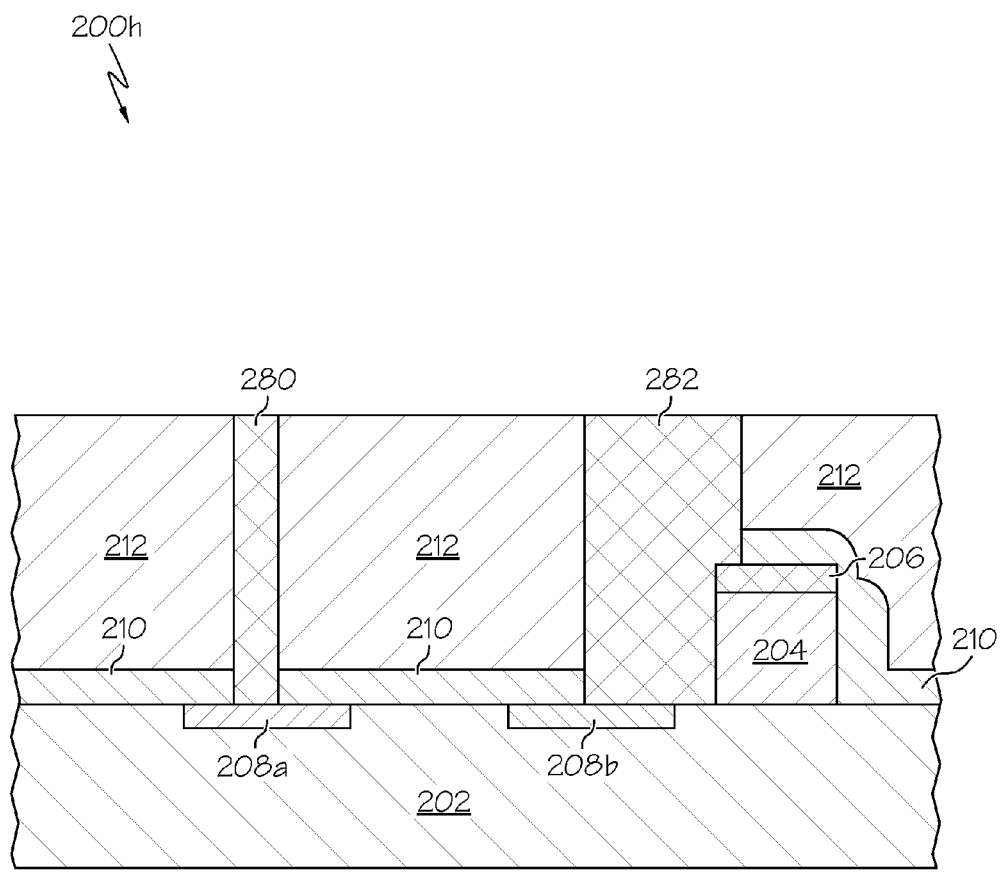

Although other fabrication steps or sub-processes may be performed at this time, this example continues by creating conductive plugs 280, 282 in the contact recesses 264, 266. FIG. 10 depicts the state of the semiconductor device structure 200h after formation of the conductive plugs 280, 282. For this example, the conductive plug 280 corresponds to, and establishes contact with, the conductive contact element 208a. In this regard, the conductive plug 280 represents an individual, single, or distinct plug that may exhibit critical dimension characteristics (relative to the particular process node technology). The conductive plug 282, however, corresponds to, and establishes contact with, the conductive contact element 208b and the conductive contact element 206. Accordingly, the conductive plug 282 represents a shared or cross coupled plug that bridges at least two terminals of the transistor device.

It should be appreciated that FIG. 10 depicts the result of a number of conventional process steps, which will not be described in detail here. For this exemplary embodiment, the conductive plugs 280, 282 can be formed by etching the exposed sections of the stress liner 210 to reveal the conductive contact elements 206, 208, and by filling the contact recesses 264, 266 (see FIG. 9) with a conductive material such as tungsten. Thereafter, a number of conventional process steps can be performed to complete the fabrication of the conductive plugs 280, 282. For example, chemical mechanical polishing can be performed to remove any overburden portion of the conductive plug material. Thereafter, fabrication of the semiconductor device structure 200 can be completed in an ordinary and conventional manner.

The conformal liner 252 and, in particular, the lined sidewalls 256, 258, enable the contact patterning technique to reduce the amount of shrinkage associated with larger cross coupled contacts while still preserving the desired amount of shrinkage associated with individual contacts that may be designed to have the smallest possible size allowed by the process node technology. FIGS. 11-14 are diagrams that illustrate the differences between a conventional contact patterning process and a patterning process that follows the approach described above.

Figure 12:
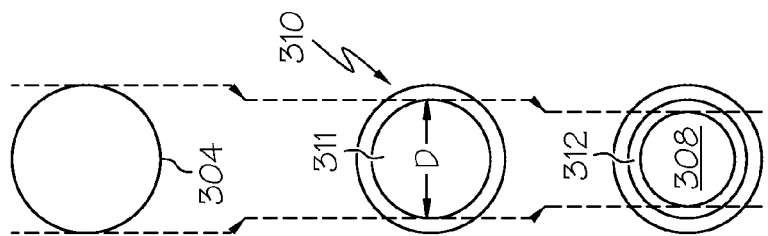
FIG. 12 is a diagram that illustrates the shrinkage effect for an individual contact plug fabricated in accordance with an exemplary embodiment of the fabrication process presented herein.
Figure 11:
FIG. 11 is a diagram that illustrates the shrinkage effect for an individual contact plug fabricated in accordance with a conventional process.

FIG. 11 is a diagram that illustrates the shrinkage effect for an individual contact plug 302 fabricated in accordance with a conventional process. The large circle represents an oversized opening 304 defined in a photoresist mask to be used to fabricate the contact plug 302. In accordance with the conventional process, the oversized opening 304 is sized in contemplation of a desired amount of feature shrink. The amount of shrinkage can be visualized by comparing the diameter of the oversized opening 304 to the diameter of the resulting contact plug 302 (shown at the bottom of FIG. 11). For comparison, FIG. 12 is a diagram that illustrates the shrinkage effect for an individual contact plug 308 fabricated in accordance with an exemplary embodiment of the fabrication process presented herein. For this simplified example, the same oversized opening 304 is used in the photoresist mask, and the resulting diameter of the contact plug 308 is the same as the diameter of the contact plug 302 (the end result is substantially identical here).

FIG. 12 shows the intermediate stage 310 of the fabrication process, where the ARC layer has been etched to create an opening 311 having relatively steep sidewalls (i.e., the defining bottom diameter (D) of the opening is larger than that depicted in FIG. 11). The larger diameter is intentionally created to accommodate the conformal liner 312, as described above. Thus, the inner diameter of the conformal liner 312 defines the resulting diameter of the contact plug 308, as shown at the bottom of FIG. 12.

Figure 13:
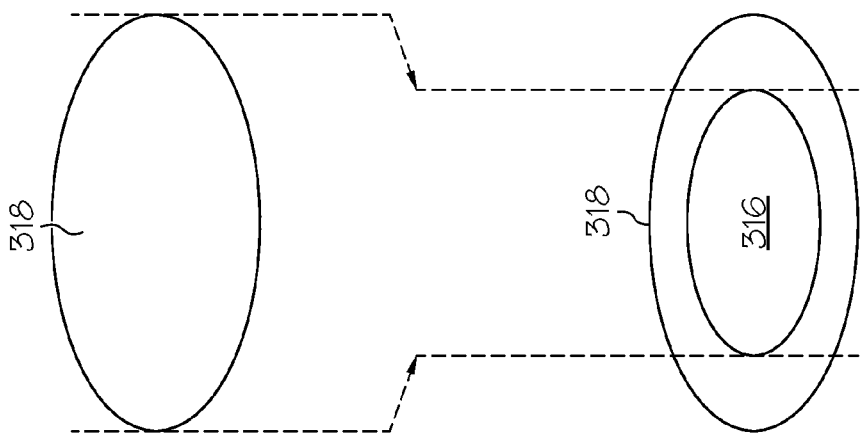
FIG. 13 is a diagram that illustrates the shrinkage effect for a cross coupled contact fabricated in accordance with a conventional process.

FIG. 13 illustrates the shrinkage effect for a cross coupled contact plug 316 fabricated in accordance with the conventional process. The large oval represents an oversized opening 318 defined in the photoresist mask to be used to fabricate the cross coupled contact plug 316. FIG. 13 shows the nonlinear shrinkage effect: the amount of shrinkage associated with the cross coupled contact plug 316 is noticeably more than the amount of shrinkage associated with the individual contact plug 302. On the other hand, FIG. 14 is a diagram that illustrates the shrinkage effect for a cross coupled contact plug 322 fabricated in accordance with an exemplary embodiment of the fabrication process presented herein.

Figure 14:
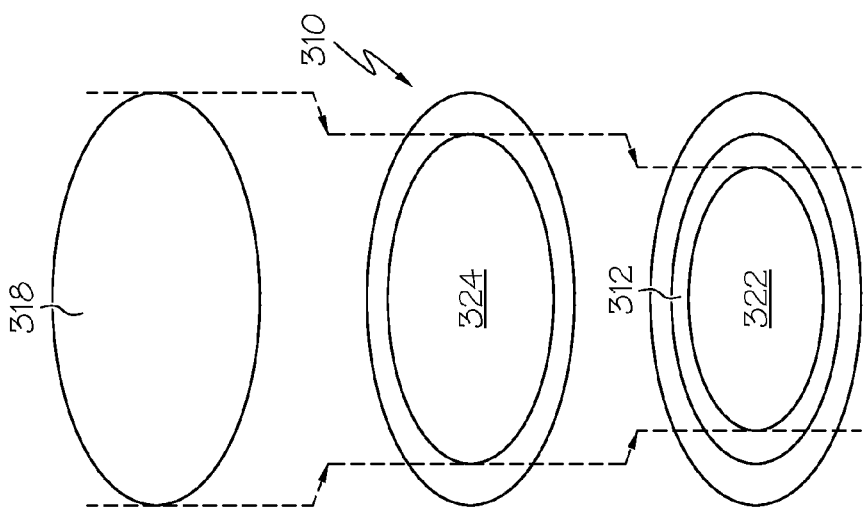
FIG. 14 is a diagram that illustrates the shrinkage effect for a cross coupled contact fabricated in accordance with an exemplary embodiment of the fabrication process presented herein.

FIG. 14 also shows the intermediate stage 310 of the fabrication process, where the ARC layer has been etched to create an opening 324 having relatively steep sidewalls. Notably, this opening 324 is appreciably larger than the cross coupled contact plug 316. The larger size of the opening 324 is intentionally created to accommodate the conformal liner 312, as described above. Formation of the conformal liner 312 may be considered to be a linear process in that the thickness of the conformal liner 312 is relatively consistent regardless of the size of the holes, recesses, or cavities in which the liner material is deposited. Thus, even though the conformal liner 312 results in further feature shrinkage associated with the opening 324, the resulting size of the cross coupled contact plug 322 is noticeably larger than the size of the conventionally formed cross coupled contact plug 316. The increased size of the cross coupled contact plug 322 is realized with little to no corresponding increase in the size of the individual contact plug 308 (see FIG. 11 and FIG. 12).

Figure 15:
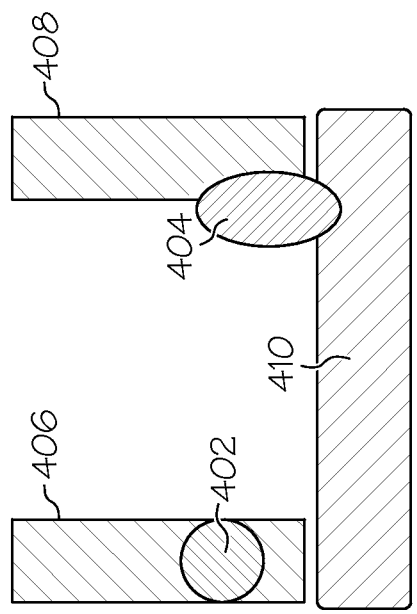
FIG. 15 is a schematic top view that illustrates an individual contact plug and a cross coupled contact fabricated in accordance with a conventional process.

The problem with excessive shrinkage in a cross coupled contact plug is illustrated in FIG. 15, which shows a schematic top view of an individual contact plug 402 and a cross coupled contact plug 404 fabricated in accordance with a conventional process. For this simplified example, the contact plug 402 is properly aligned with, and establishes good contact with a corresponding device contact region 406. In contrast, only a small section of the cross coupled contact plug 404 makes contact with a first device contact region 408 (e.g., a source or drain contact region). Likewise, only a small section of the cross coupled contact plug 404 makes contact with a second device contact region 410 (e.g., a gate contact region). Indeed, the amount of "overlap" between the cross coupled contact plug 404 and the device contact regions 408, 410 may be inadequate to support normal and reliable operation of the semiconductor device.

Figure 16:
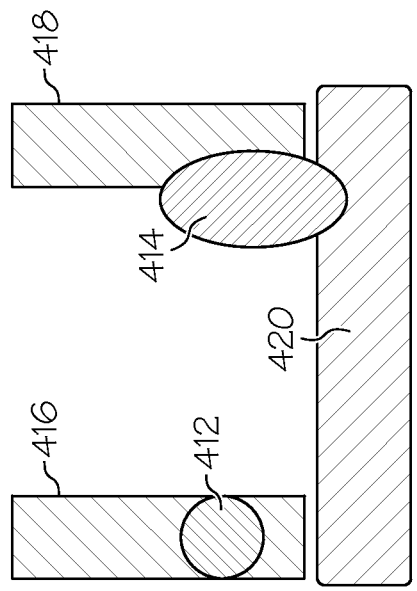
FIG. 16 is a schematic top view that illustrates an individual contact plug and a cross coupled contact fabricated in accordance with an exemplary embodiment of the fabrication process presented herein.

FIG. 16 is a schematic top view that illustrates an individual contact plug 412 and a cross coupled contact plug 414 fabricated in accordance with an exemplary embodiment of the fabrication process presented herein. The contact plug 412 remains aligned with the corresponding device contact region 416. However, the cross coupled contact plug 414 is noticeably larger than the cross coupled contact plug 404 shown in FIG. 15. Indeed, the controlled shrinkage of the cross coupled contact plug 414 results in more overlap and, accordingly, better contact with, the corresponding device contact regions 418, 420.

The fabrication process described above with reference to FIGS. 3-10 represents one exemplary embodiment that utilizes an organic material for the conformal liner 252. As explained with reference to FIG. 6, the conformal liner 252 is formed after creating the recesses 242, 244 in the OPL 216. Another exemplary embodiment of the fabrication process instead employs an inorganic material for the conformal liner, and creates the conformal liner earlier in the fabrication flow. In this regard, FIGS. 17-20 are cross sectional views that illustrate another exemplary semiconductor device structure 500 and its related fabrication process. Many of the exemplary features, characteristics, and process steps associated with the semiconductor device structure 500 are similar or identical to those described above for the semiconductor device structure 200. For the sake of brevity and clarity, common or shared aspects will not be redundantly described here in the context of the semiconductor device structure 500.

Figure 17:
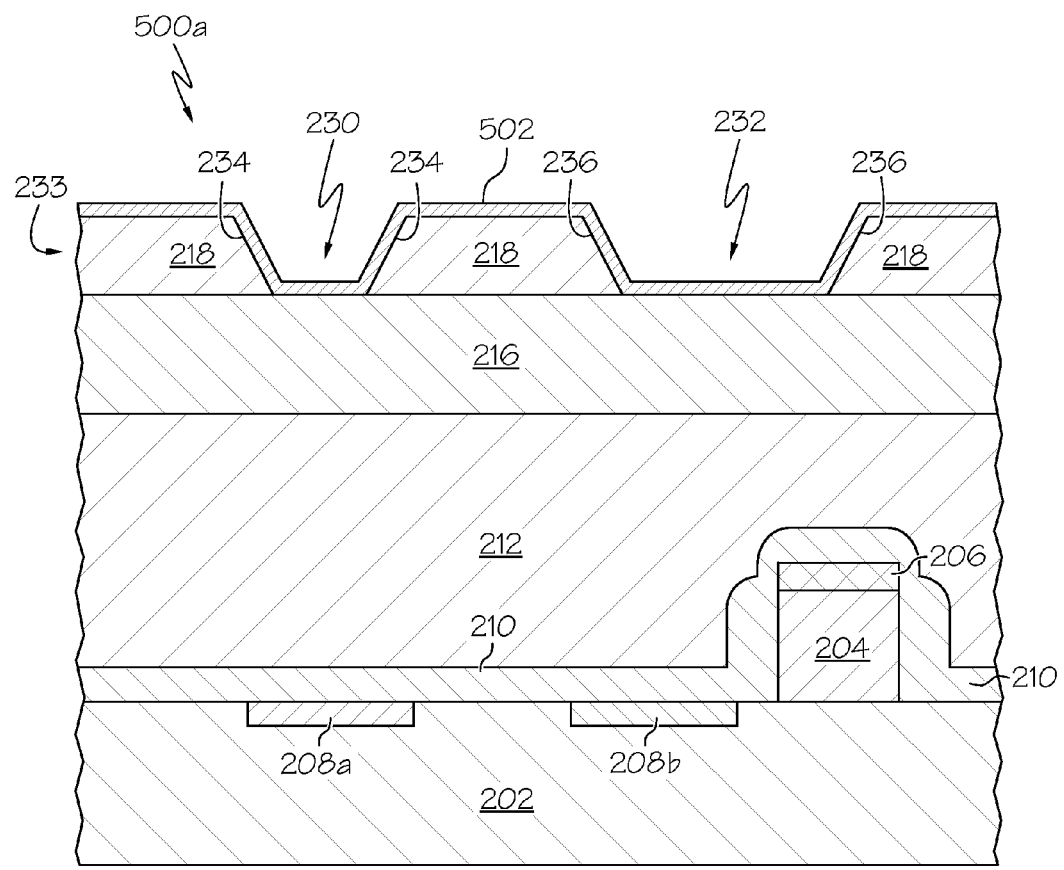
FIGS. 17-20 are cross sectional views that illustrate another exemplary semiconductor device structure and its related fabrication process.

FIG. 17 depicts the state of the semiconductor device structure 500a after formation of a conformal liner 502. In contrast to the previously described approach, the conformal liner 502 is formed after the patterned ARC layer 233 has been created, but before etching any of the underlying layers. Accordingly, the conformal liner 502 is preferably formed overlying the patterned ARC layer 233 and within the openings 230, 232 defined in the patterned ARC layer 233. In certain embodiments, the conformal liner 502 formed by conformally depositing an inorganic liner material (such as a low temperature oxide material) overlying the exposed portions of the OPL 216 and overlying the exposed ARC material 218 (including the inwardly tapered sidewalls 234, 236). An inorganic liner material is used here for purposes of etch selectivity, as will become apparent from the following description. Moreover, the inorganic liner material serves to reinforce or buttress certain mask features that are intended to separate the resulting conductive contact plugs (this feature is described in more detail below with reference to FIGS. 21 and 22). In practice, the liner material for the conformal liner 502 may be deposited using, for example, chemical vapor deposition (CVD).

Figure 18:
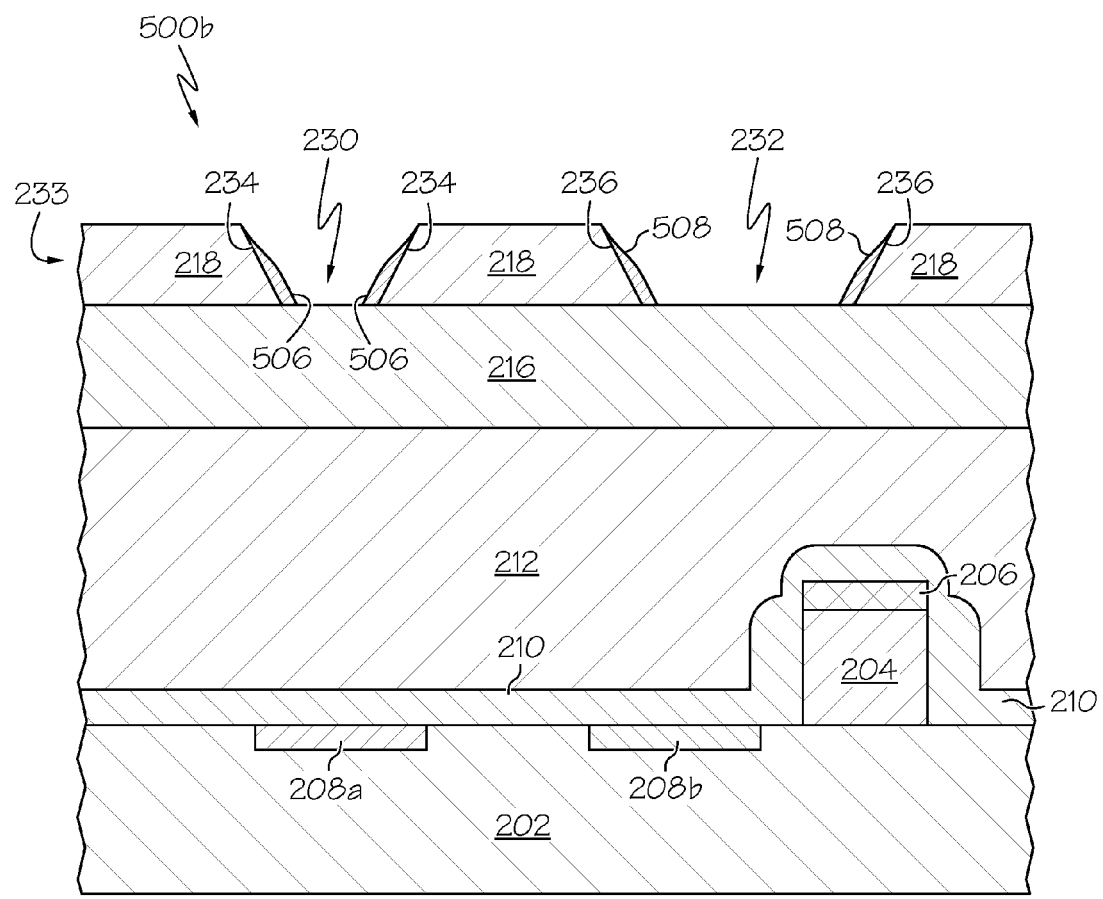

Next, the conformal liner 502 is selectively etched to expose portions of the underlying OPL 216. FIG. 18 depicts the state of the semiconductor device structure 500b after the conformal liner 502 has been etched. This etching step results in lined sidewalls 506, 508 for the openings 230, 232 defined in the patterned ARC layer 233. In preferred embodiments, the conformal liner 502 is directionally etched using an etch chemistry that attacks the inorganic liner material but does not etch the ARC material 218 or the OPL 216 by any appreciable amount. In certain embodiments, the conformal liner 502 is etched by an RIE process using a $CF_4$ based chemistry. As depicted in FIG. 18, the directional nature of this etching step effectively removes the horizontal sections of the conformal liner 502, i.e., the sections on the top of the ARC material 218 and the sections at the bottoms of the openings 230, 232.

Figure 19:
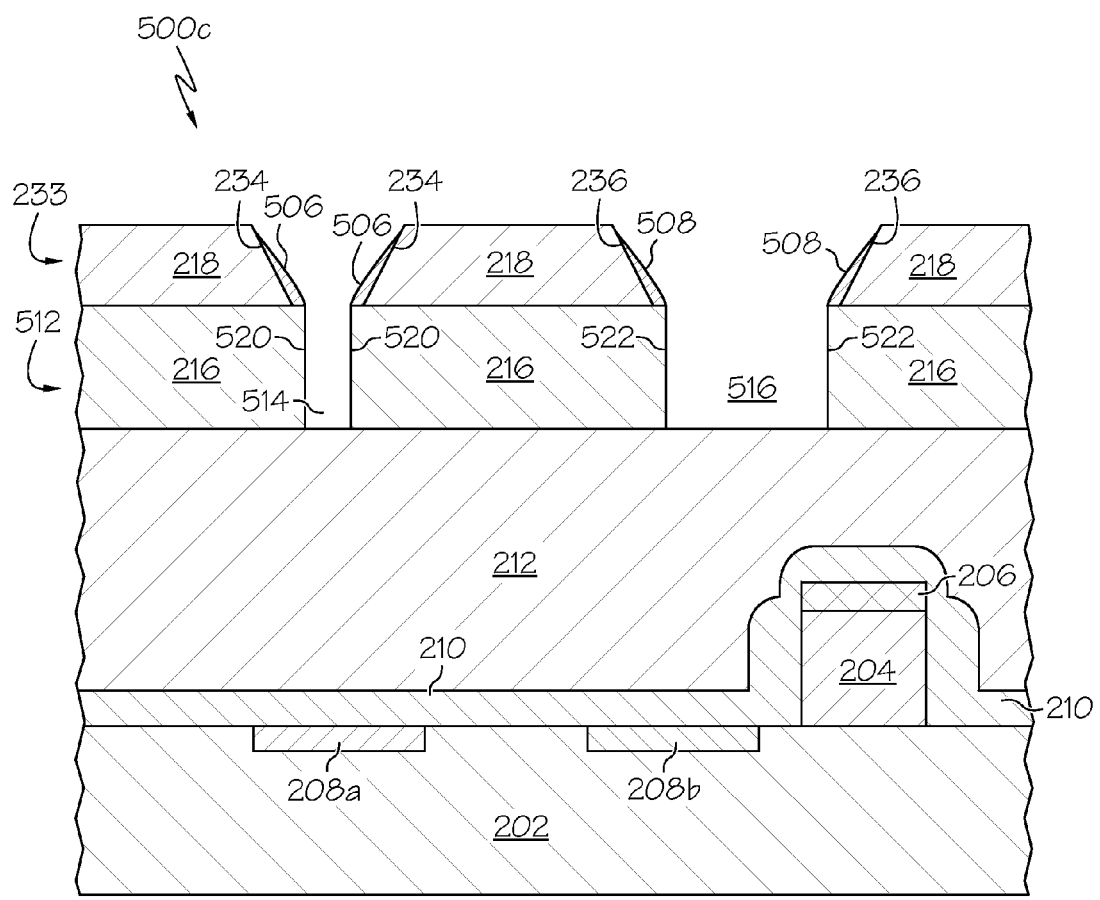

After the lined sidewalls 506, 508 have been fabricated, the process continues by etching the OPL 216 using the patterned ARC layer 233 and the lined sidewalls 506, 508 as an etch mask. FIG. 19 shows the semiconductor device structure 500c after the OPL 216 has been etched into a patterned OPL 512. The OPL 216 is directionally etched to form recesses 514, 516 and to expose portions of the underlying ILD material 212. The recesses 514, 516 are fabricated with vertical sidewalls 520, 522 that are defined by the lowermost dimensions of the lined sidewalls 506, 508, as depicted in FIG. 19.

Figure 20:
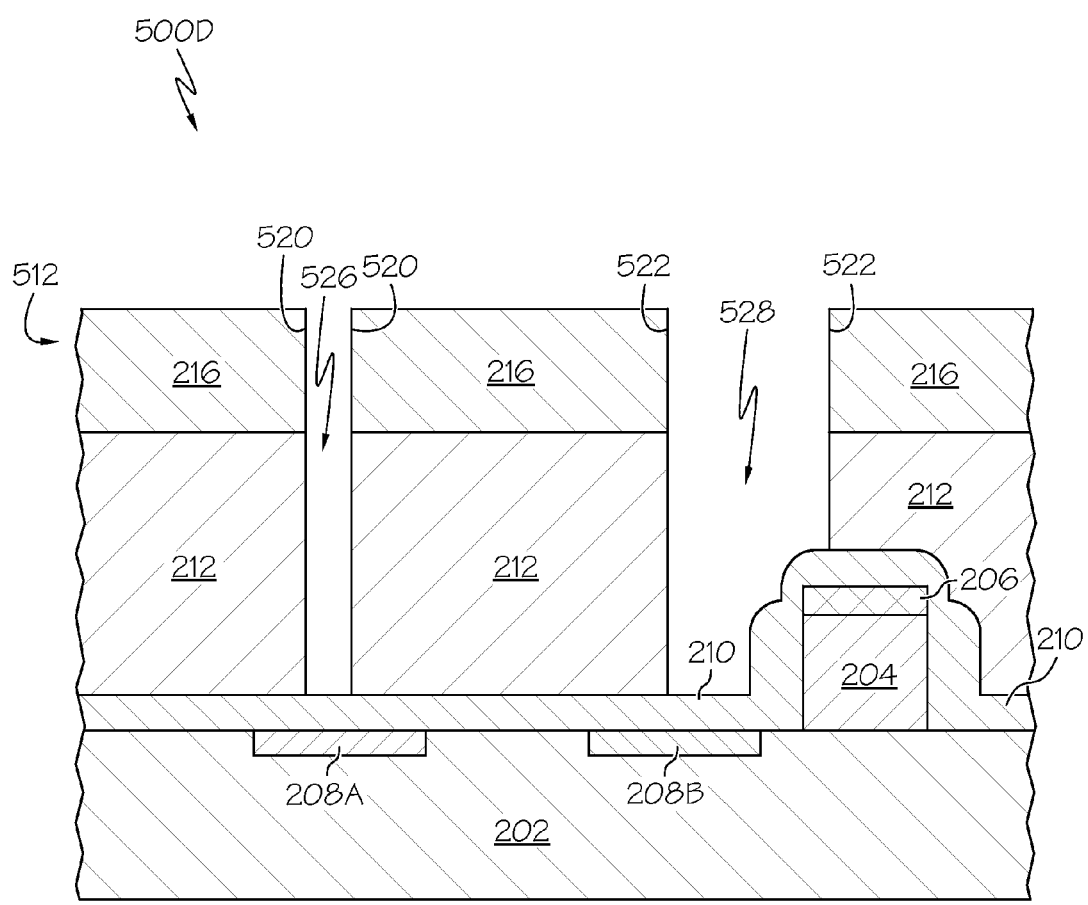

The process continues by etching the ILD material 212, using the patterned OPL 512 as an etch mask, to form contact recesses 526, 528 in the ILD material 212. FIG. 20 illustrates the semiconductor device structure 500d after formation of the contact recesses 526, 528. In preferred embodiments, the ILD material 212 is anisotropically etched using an etch chemistry that selectively attacks the ILD material 212 without etching the OPL 216 and without etching the material used for the stress liner 210 by any appreciable amount. The exposed ARC material 218 and the lined sidewalls 506, 508 are also removed during this etching step, due to the inorganic nature of those materials. In certain embodiments, the ILD material 212 is etched by an RIE process using a $C_xF_y/O_2$ based chemistry.

After the contact recesses 526, 528 have been created, the process continues as described above to fabricate the conductive plugs and to otherwise complete the manufacture of the semiconductor device structure 500. These additional process steps and the resulting device structure are not shown.

The conformal liner 502 and the lined sidewalls 506, 508 enable this alternate contact patterning approach to reduce the amount of shrinkage associated with larger cross coupled contacts while still preserving the desired amount of shrinkage associated with individual contacts that may be designed to have the smallest possible size allowed by the process node technology. Moreover, the formation of the conformal liner 502 and the presence of the lined sidewalls 506, 508 during the contact patterning process can prevent or reduce feature merging, especially when small scale process node technology is utilized (e.g., 28 nm and below). In this regard, FIG. 21 is a schematic top view that illustrates feature merging associated with a conventional fabrication process, and FIG. 22 is a schematic top view that illustrates feature separation associated with an exemplary embodiment of the fabrication process presented herein.

Referring to FIG. 21, a photoresist mask 602 with various spaced apart features is depicted. As explained above, the features defined in the photoresist mask 602 are oversized to contemplate feature shrinking. The photoresist mask 602 illustrated in FIG. 21 includes a bridge 604 that separates two of the openings 606. Unfortunately, the effect of the bridge 604 may be reduced or eliminated during the formation of the resulting contact plugs 608. The bridge 604 may be eroded as a result of the various etching steps that are responsible for the shrinking of the features and the formation of the recesses and vias needed to complete the fabrication of the contact plugs 608. Erosion of the bridge 604 to the extent depicted in FIG. 21 results in the merging of the two contact plugs 608. In other words, the two contact plugs 608 are no longer separated as originally intended.

Referring again to FIGS. 17-20, the conformal liner 502 and the lined sidewalls 506, 508 also function to reinforce, protect, and buttress portions of the patterned mask that are intended to separate different features. For example, the lined sidewalls 506, 508 function to maintain the integrity of the ARC material 218 that separates adjacent openings. Even though the lined sidewalls 506, 508 are ultimately removed, their presence reduces erosion that might otherwise occur in sections of the mask pattern that are intended to keep critical contact features separated. FIG. 22 demonstrates how the bridge 604 is maintained between the two adjacent contact plugs 614. In other words, at least some of the bridge 604 remains throughout the various etching steps that are needed to produce the contact plugs 614. As shown at the bottom of FIG. 22, the two contact plugs 614 have not merged together, and they remain separated as two distinct elements.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of fabricating a semiconductor device, the method comprising:
    forming an organic planarization layer overlying a semiconductor device structure having conductive contact elements;
    forming an antireflective coating layer overlying the organic planarization layer;
    forming a photoresist layer overlying the antireflective coating layer;
    removing portions of the photoresist layer to create a patterned photoresist layer having openings corresponding to the conductive contact elements;
    plasma etching the antireflective coating layer using the patterned photoresist layer as a first etch mask, resulting in a patterned antireflective coating layer, wherein the plasma etching forms openings with inwardly tapered sidewalls in the antireflective coating layer, and wherein the openings terminate at exposed portions of an upper surface of the organic planarization layer;
    after the plasma etching, directionally etching the organic planarization layer using the patterned antireflective coating layer as a second etch mask, resulting in a patterned organic planarization layer having recesses formed therein, wherein the directional etching forms the recesses with vertical sidewalls defined by, and aligned with, bottom perimeter shapes of the openings in the patterned antireflective coating layer;
    after the directional etching, depositing a conformal liner within the recesses; and
    etching the conformal liner to expose an interlayer dielectric of the semiconductor device structure.

2. The method of claim 1, wherein directionally etching the organic planarization layer exposes portions of the interlayer dielectric.

3. The method of claim 2, wherein forming the conformal liner comprises conformally depositing a liner material overlying exposed portions of the interlayer dielectric and on exposed sidewalls of the patterned organic planarization layer.

4. The method of claim 1, wherein:
    etching the conformal liner results in lined sidewalls for the recesses formed in the organic planarization layer; and
    the method further comprises etching the interlayer dielectric to form contact recesses in the interlayer dielectric, the contact recesses having sidewalls aligned with and defined by the lined sidewalls.

5. The method of claim 4, further comprising:
    removing residual portions of the patterned antireflective coating layer;
    removing residual portions of the patterned organic planarization layer; and
    removing residual portions of the conformal liner.

6. The method of claim 5, further comprising creating conductive plugs in the contact recesses, the conductive plugs corresponding to the conductive contact elements of the semiconductor device structure.

7. A method of fabricating a semiconductor device, the method comprising:
    forming an organic planarization layer overlying a semiconductor device structure having conductive contact elements;
    forming an antireflective coating layer overlying the organic planarization layer;
    forming a photoresist layer overlying the antireflective coating layer;
    removing portions of the photoresist layer to create a patterned photoresist layer having openings corresponding to the conductive contact elements;
    plasma etching the antireflective coating layer using the patterned photoresist layer as a first etch mask, resulting in a patterned antireflective coating layer having openings defined therein, wherein the openings are formed with inwardly tapered sidewalls, and wherein the openings terminate at exposed portions of an upper surface of the organic planarization layer;
    after the plasma etching, forming a conformal liner overlying the patterned antireflective coating layer and within the openings defined in the patterned antireflective coating layer;
    directionally etching the conformal liner to expose portions of an upper surface of the organic planarization layer, wherein directionally etching the conformal liner results in lined sidewalls for the openings defined in the patterned antireflective coating layer; and
    after etching the conformal liner, directionally etching the organic planarization layer using the patterned antireflective coating layer and the lined sidewalls as a second etch mask, resulting in a patterned organic planarization layer, wherein directionally etching the organic planarization layer forms recesses with vertical sidewalls defined by lowermost dimensions of the lined sidewalls, and aligned with, bottom.

8. The method of claim 7, wherein:
    directionally etching the organic planarization layer exposes portions of an interlayer dielectric of the semiconductor device structure; and
    the method further comprises etching the interlayer dielectric, using the patterned organic planarization layer as a third etch mask, to form contact recesses in the interlayer dielectric.

9. The method of claim 8, further comprising creating conductive plugs in the contact recesses, the conductive plugs corresponding to the conductive contact elements of the semiconductor device structure.

10. The method of claim 7, wherein forming the conformal liner comprises conformally depositing a liner material overlying exposed portions of the organic planarization layer.

* * * * *